(12) United States Patent
Eickemeyer et al.

(10) Patent No.: US 7,285,174 B2
(45) Date of Patent: Oct. 23, 2007

(54) METHOD FOR PRODUCING METALLIC STRIPS

(75) Inventors: Joerg Eickemeyer, Dresden (DE); Dietmar Selbmann, Comnitz (DE); Ralph Opitz, Dresden (DE)

(73) Assignee: Leibniz-Institut fuer Festkoerper-und Werkstoffforschung Dresden e.V., Dresden (DE)

( * ) Notice: Subject to any disclaimer, the term of this patent is extended or adjusted under 35 U.S.C. 154(b) by 540 days.

(21) Appl. No.: 10/487,382

(22) PCT Filed: Aug. 29, 2002

(86) PCT No.: PCT/DE02/03193

§ 371 (c)(1),
(2), (4) Date: Mar. 25, 2004

(87) PCT Pub. No.: WO03/024637

PCT Pub. Date: Mar. 27, 2003

(65) Prior Publication Data

US 2004/0238085 A1 Dec. 2, 2004

(30) Foreign Application Priority Data

Aug. 30, 2001 (DE) ................. 101 43 680

(51) Int. Cl.
*C22F 1/04* (2006.01)
*C22F 1/08* (2006.01)
*C22F 1/10* (2006.01)
*C22F 1/14* (2006.01)
*C22F 1/16* (2006.01)

(52) U.S. Cl. ............... 148/690; 148/676; 148/677; 148/678; 148/680; 148/681; 148/684; 148/685

(58) Field of Classification Search ............... None
See application file for complete search history.

(56) References Cited

U.S. PATENT DOCUMENTS 3,318,129 A    5/1967   Gross (Continued)

FOREIGN PATENT DOCUMENTS

GB          519 604        4/1940

OTHER PUBLICATIONS

A Dictionary of Metallurgy, A. D. Merriam, 1958, p. 27.*

*Primary Examiner*—John P. Sheehan
(74) *Attorney, Agent, or Firm*—Jordan and Hamburg LLP

(57) ABSTRACT

A method for producing metallic strips having a high-grade cube texture based on nickel, copper, aluminum, silver or alloys of these metals including austenitic iron-nickel alloys makes it possible to obtain, during a subsequent annealing process and with lower total degrees of forming, a recrystallization cube layer of a quality equal to that of one obtained using customary roll forming and produces a better quality cube texture with comparable total degrees of forming. To this end, a forming method is provided during which the materials are formed by cold drawing before their recrystallization annealing thereby rendering them high-grade. The tools used for this include: a) non-driven roll devices with an axially parallel flat pair of rolls or turk's head arrangements with two pairs of rolls or; b) fixed drawing jaws that are slanted toward one another. The strips produced according to the invention can be used, for example, as a coating support for producing strip-shaped high-temperature superconductors.

Figure 1A:
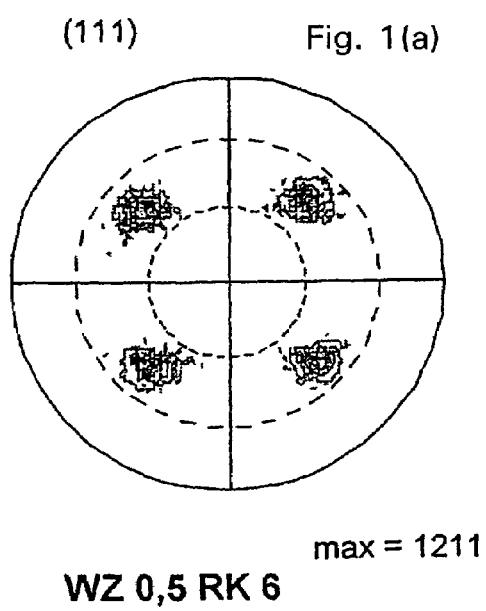

8 Claims, 4 Drawing Sheets max = 1211
WZ 0,5 RK 6 max = 2520
WZ 0,18 RK6 max = 2704
WZ 0,08 RK6

U.S. PATENT DOCUMENTS

| | | | |
|---|---|---|---|
| 4,142,919 A | * 3/1979 | Maiffredy et al. | 148/596 |
| 4,374,679 A | * 2/1983 | Masumoto et al. | 148/557 |
| 4,883,545 A | * 11/1989 | Matlock et al. | 148/500 |
| 5,141,566 A | * 8/1992 | Kitayama et al. | 148/670 |
| 5,741,377 A | * 4/1998 | Goyal et al. | 148/512 |
| 5,981,444 A | 11/1999 | Sawada et al. | |
| 6,180,570 B1 | 1/2001 | Goyal | |
| 6,800,153 B2 | * 10/2004 | Ishii et al. | 148/671 |

* cited by examiner (111)
max = 1211
WZ 0,5 RK 6

(111)
max = 2704
WZ 0,08 RK6

(111)
max = 2520
WZ 0,18 RK6

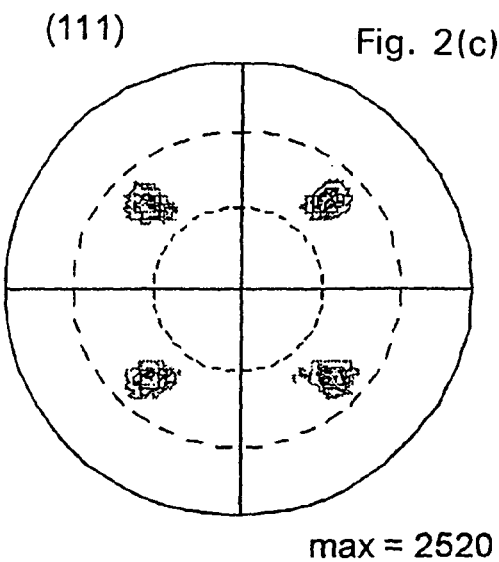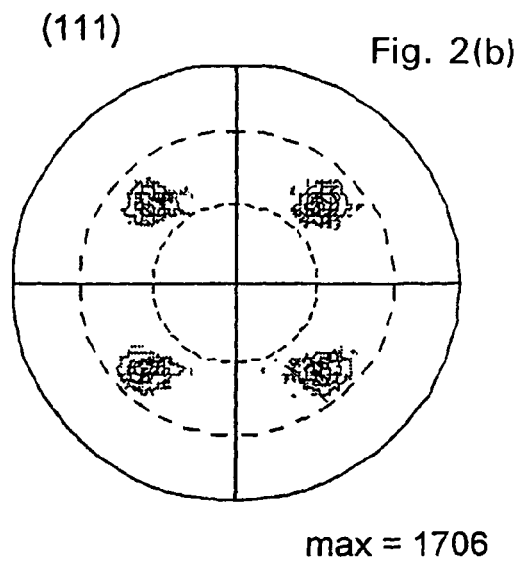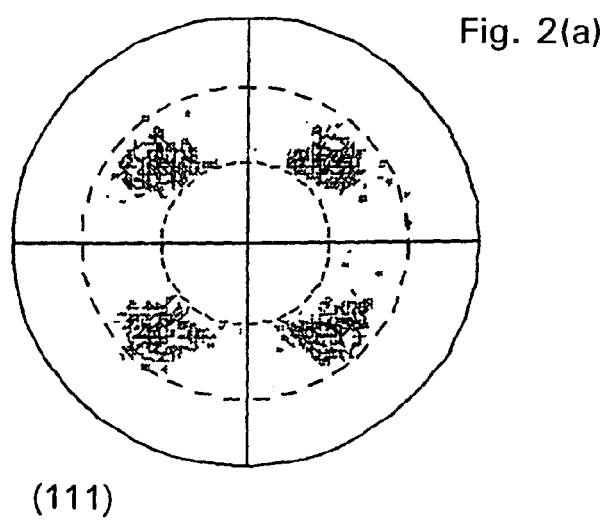

Relative reflection instensity $I_{(100)}$ of a pure nickel strip after cold conversion followed by recrystallization at 600°C

METHOD FOR PRODUCING METALLIC STRIPS

BACKGROUND OF THE INVENTION

The invention relates to a method for producing metallic strips based on nickel, copper, aluminum, silver or the alloys of these metals, which have a high-grade annealed texture with a cubic layer.

Basically, the method can be applied to all metallic materials, which tend to form the cubic texture after cold or hot drawing and a subsequent recrystallization. These include the metallic materials with cubic, face-centered lattices, such as nickel, copper, gold and, under special conditions, silver as well as a portion of their alloys, including the austenitic Fe-Ni alloys. One the other hand, this applies to aluminum after it is hot drawn by rolling.

The strips, prepared according to the new method, can be used, for example, as a backing for physical/chemical coatings with a high-grade microstructural alignment. In this connection, the texture serves as a base for a crystallographically oriented growth of the deposited layers on the substrate. Such backings are suitable, for example, as substrates for ceramic coatings used in the field off high-temperature superconduction. The function of the substrate as an epitactic backing is linked to an almost perfect texture state and therefore requires the highest possible degree of alignment of the polycrystalline structure. Such substrate strips for layered superconductors are used in superconducting magnets, transformers, motors, tomographs or superconducting current paths.

It is known that polycrystalline metals with cubic face-centered lattices, such as copper, nickel, gold and, under certain conditions, also silver can, after a preceding strong cold drawing by rolling, develop a pronounced texture with a cubic layer during the subsequent recrystallization (G. Wassermann: Textures of Metallic Materials, Springer, Berlin, 1939; H. Hu et al.: Trans. ASM 224 (1962) 96-105). The basic work (W. Köster: Z. Metallkde. 18 (1926) 112-116) and also the further investigations (R. D. Doherty et al.: Mater. Sci. Eng. A257 (1138) 18-36) were carried out on the basis of rolling the strip followed by an annealing treatment.

Metal strips, especially nickel and silver strips, textured in this way by rolling and annealing, are used at the present time as a backing for metallic coatings, ceramic buffer layers and ceramic superconducting layers (U.S. Pat. No. 5,741, 377). The suitability of such metal strips as a substrate material depends primarily on the degree of texturing, which can be achieved, as well as on their quality directly on the surface.

It is also known that, by alloying pure metals with other elements, the degree of texture formation generally decreases greatly as the content of alloy increases. (R. E. Smallman: Journ. Inst. Metals 84 (1955-56) 10-18). For example, the recrystallization temperature of aluminum is raised and the cubic texture clearly decreased by small contents of iron ranging from 10 to 300 ppm (W. B. Hutchinson, H.-E. Ekström: Mater. Sci. Technol. 6 (1190) 1103-1111). It was also shown that magnesium has a very strong negative effect on the ability to texture nickel (K. Detert et al.: Z. Metallkde. 54 (1963) 263-270). As little as 600-atom ppm is sufficient to prevent the development of the cubic texture. Elements have also been shown to increase the recrystallization temperature of nickel (K. Detert, G. Dressler: Acta Metall. 13 (1965) 845-833). This also holds good, for example, for chromium and molybdenum as alloying elements. On the other hand, their specific effect on the sharpness and the thermal stability of the annealed texture, especially for contents of their solubility in nickel is not clear. It was found that a cubic texture can no longer be achieved with 3 atom percent of molybdenum (K. Deter et a.: Z. Metallkde. 54 (1963) 263-270).

At higher contents of alloy, it is to be expected that, for example, the primary recrystallization texture of the nickel as a cubic texture is developed less completely as was shown for nickel-molybdenum and nickel-tungsten alloys (J. Eickmeyer et al.: Supercond. Sci. Technol. 14 (2001) 152-159). Moreover, a reduction in the primary cubic texture, which has been grown, due to secondary recrystallization processes is to be expected (R. E. Smallman, C. S. Lee: Mater. Sci. Eng. A184 (1994) 97-112). Such higher temperatures of 700° C. to 800° C. are reached under the customary cutting conditions, which exist when superconducting layers are deposited.

Aside from the chemical effects of alloys on the quality of the texture, the development of the cubic texture by recrystallization is coupled, above all, also with specific mechanical converting prerequisites. A high minimum degree of conversion during cold rolling is indispensable, a finely grained starting structure of the material converted being advantageous. For copper, the minimum degree of conversion is 82% (O. Dahl, F. Pawlek: Z. Metallkde. 28 (1936) 266-271). However, significantly higher degrees of conversion, which, in some cases, exceed a reduction in thickness of 99%, are applied in order to achieve high-grade texturing. This technically very expensive manufacturing technology is presently being put up with, since alternative techniques have not been seen for decades.

Accordingly, shaping methods, other than rolling, practically do not play a role at the present time in the manufacture of metal strips with a cubic texture. One of the major causes of this is the absence of experimental investigations with respect to the suitability of other conversion methods for producing strip, since these have previously not been of interest because of the demonstrated effectiveness of rolling for producing strip.

There is no generally valid theory concerning the effects of stress states and deformation states on the development of conversion textures and annealed textures of the metals, particularly of nickel, copper, gold and silver. It is, therefore, not possible to calculate reliably the effectiveness of a conversion method on the development of deformation texture and annealed textures. Moreover, the friction conditions between the material being converted and the conversion tool affects the formation of texture in strips and especially in thin strips in a manner, which has been unpredictable in the past.

The growing interest in largely ideal, annealed textures for using strips as very long quasi single-crystalline substrates (superconducting layer conductors) is associated at the same time with the requirement for an almost perfect texture not only in the interior of the strip, but also, in particular, on the surface of such coating substrates. For this reason, all factors, which possibly may interfere with the development of texture, are to be evaluated critically and, if possible, prevented. Last, but not least, this applies for the optimum process conditions during the conversion of the material, which previously have been limited to the parameters during rolling.

SUMMARY OF THE INVENTION

It is an object of the invention to provide a method for producing metallic strips with a high-grade cubic texture on the basis of nickel, copper, aluminum, silver or alloys of these metals which, in comparison to conventional conversion by rolling, make a qualitatively equivalent recrystallized cubic state during the subsequent annealing process possible at a lower degree of overall conversion or which produces a qualitatively better cubic texture at a comparable total degree of conversion.

Pursuant to the invention, the materials, before their recrystallization annealing, are converted extensively by cold drawing with:

a) roller equipment, which is not driven, with an axially parallel, flat roller-pair or Turk-head arrangement with two roller pairs, or b) stationary, mutually inclined drawing jaws being used as tools.

The type of tool of the not driven roller pair, provided pursuant to the invention, is described, for example, in F. Dohmann, R. Kopp and J. Mittendorff: Durchziehen; in: Umformatechnik, Plastomechanik and Werkstoffkunde (Drawing through: in Conversion Technology, Plastomechanics and Material Science), Publisher: W. Dahl, R. Kopp, and O. Pawelski, Verlag Stahleisen, Düsseldorf, 1993, page 792.

Information concerning Turk-head tools, which are not driven, can be obtained by someone schooled in the art from J. A. Schey: Tribology in Metal Working, ASM, Metals Park, Ohio, 1984, page 352.

The stationary drawing jaws, provided pursuant to the invention, are described, for example, by S. Kalpakjian in Manufacturing Processes for Engineering Materials, Addison-Wesley Publishing Company, Reading, Mass., 1991, page 384, According to one embodiment of the invention, the cold drawing is carried out with a thickness reduction $\epsilon_h$ of more than 50% and preferably of more than 90%.

Advantageously, the cold drawing can be combined with a roller conversion, which is customary for alloys, which can be converted only with difficulty.

In this connection, the method of cold drawing should be employed predominantly.

Advantageously, the final surface smoothing of the strips is carried out by means of finishing milling or by means of a different method of finishing of surfaces, especially by means of burnishing.

The type of burnishing is described, for example, by W. Machu in: Oberflächenvorbehandlung von Eisen und Nichteisenmetallen (Surface pretreatment of ferrous and non-ferrous metals), Akademische Verlagsgesellschaft Geest & Portig, Leipzig, 1957, page 850.

The metallic materials, treated with the inventive method, are subsequently subjected to a recrystallizing annealing in a reducing or non-oxidizing atmosphere in order to achieve the cubic texture. The recrystallizing annealing is carried out at temperatures that are known to those skilled in the art.

By means of the inventive method, the relative degree of texturing of the cubic layer after cold drawing and annealing is achieved with reductions in thickness, which are significantly less than those employed when the previous cold drawings were used. This advantage of drawing through in comparison to rolling exists for roll drawing by means of roller tools as well as for sliding drawing, roll drawing being more effective.

Although the methods of drawing through are conversion methods, which have been known for a long time, their effect on the conversion and annealing textures in metal strips have not previously been investigated adequately. The reason for this lies therein that, for manufacturing and economic reasons, the manufacture of strips is clearly the domain of conversion by rolling. The positive effect of the drawing processes, especially that of the drawing-by-rolling process, was therefore demonstrated in a surprising manner for special treatments, such as the achieving of a high-grade cubic texture.

With that, for the application of the inventive method to the production of substrate strips, the possibility arises of producing strips, which, because of the difficulty of texturing, cannot be produced in the required quality by cold rolling and annealing. The technological possibilities are therefore expanded because the development of texture during annealing has been facilitated by the preceding cold drawing. Herein lays the essential, special advantage of the new method. In addition, for the same degree of cubic texture, a drawn strip need not be converted as much as a rolled strip. This necessarily results in a savings in energy and work.

The metals and alloys, which are to be textured, are produced metallurgically preferably by casting in a copper mold. For the starting material, the powder metallurgical production by cold and hot isostatic pressing may also be an appropriate alternative for the melt-metallurgical production.

Before the start of the subsequent, conventional hot drawing, the cast or pressed objects may be subjected to a homogenization annealing, in order to provide them with an advantageous starting structure as well as a controlled grain size for the subsequent severe cold drawing. The degree of hot drawing as well as the temperature and duration of the annealing can easily by optimized in further processes by those skilled in the art from the point of view of good cold drawablity. Advisably, the annealing atmosphere for the recrystallization is a reducing or inert atmosphere. As the content of alloy increases, the annealing temperatures and times tend towards higher values and can also be set without problems by those skilled in the art.

The conversion by drawing during roll drawing, acting in the sense of an improved development of texture, can be used as the only conversion methods for texturing as well as the main method in combination with other methods, such as slide drawing or rolling. It is up to those skilled in the art, to estimate the extend to which the conversion capability of the strip, which is to be textured, permits roll drawing or slide drawing, in order to have the positive effect of the inventive method developed to the largest extent.

The textured strips, produced by rolling, were protected under the name RABiTS (Rolling Assisted Biaxially Textured Substrates) (U.S. Pat. No. 5,741,377). On the other hand, the new abbreviation DABiTS (Drawing Assisted Biaxially Textured Substrates) was introduced by the Applicant for the strips produced pursuant to the invention.

The invention is explained below in greater detail by means of examples.

IN THE DRAWINGS

Figure 1C:
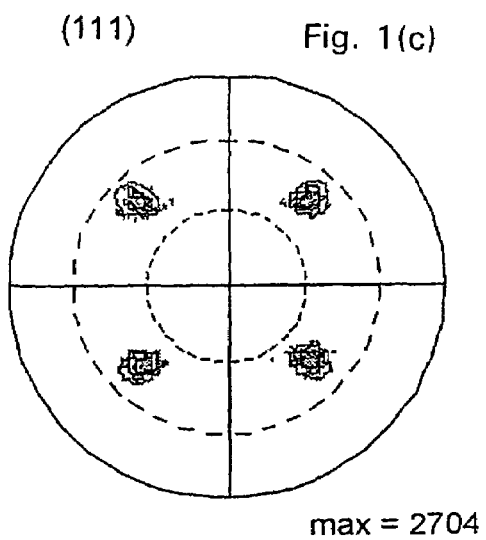
Figure 1B:
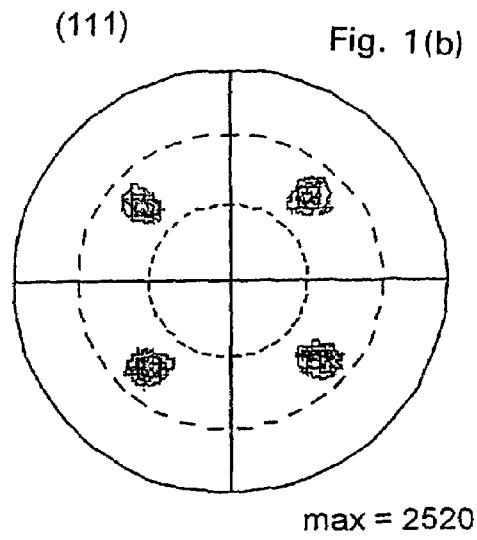

FIGS. 1(a), 1(b) and 1(c) shows show x-ray (111) pole figures of nickel with a cubic texture after different decreases in thickness by roll drawing (WZ 0.5=95%, WZ 0.18=98.2%; WZ 0.08=99.2%) and recrystallization at 600° C. for 30 min in hydrogen gas.

FIGS. 2(a), 2(b) and 2(c) shows show x-ray (111) pole figures of nickel with a cubic texture after different decreases in thickness by cold drawing (W 0.5=95%, W 0.18=98.2%; W 0.08=99.2%) and recrystallization at 600° C. for 60 min in hydrogen gas.

Figure 3:
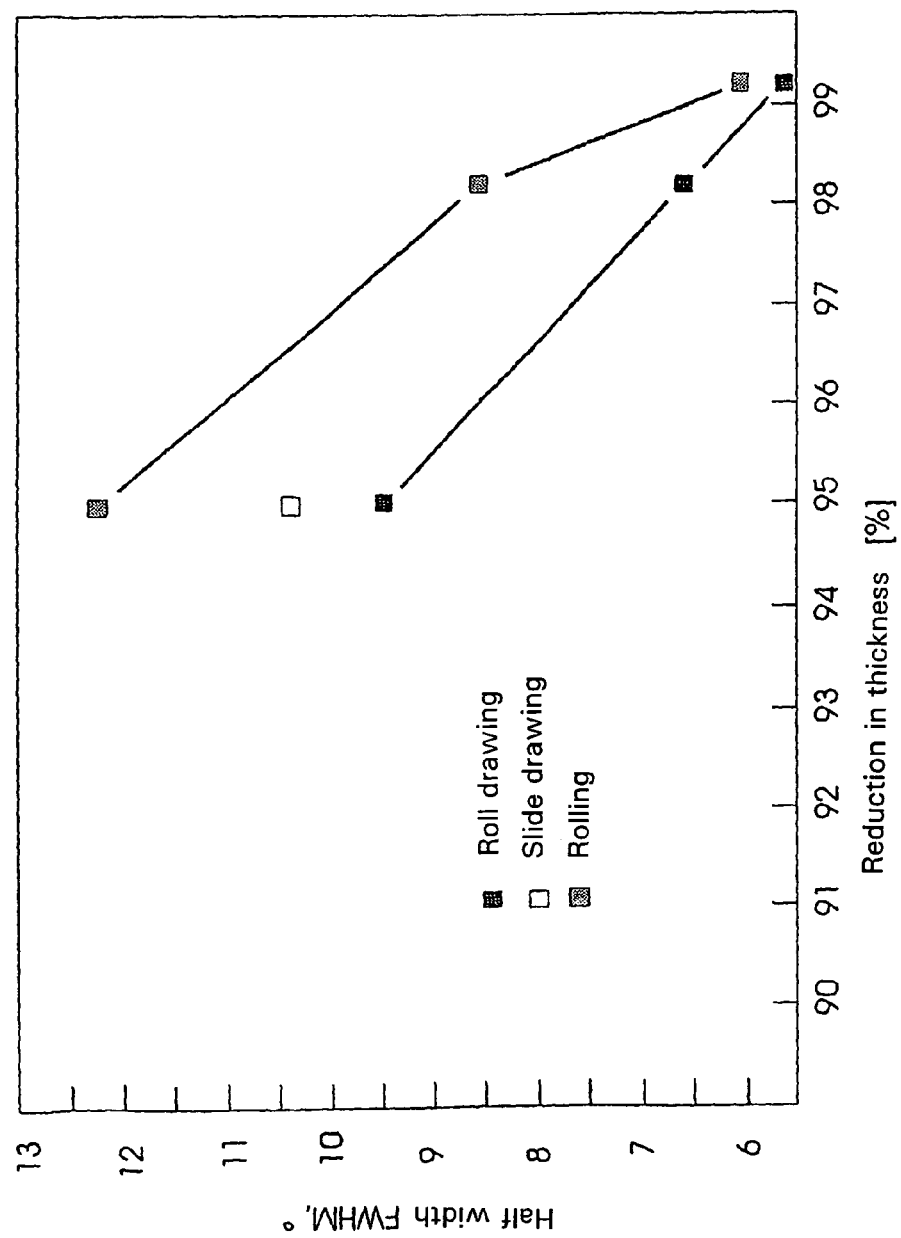
Figure 4:
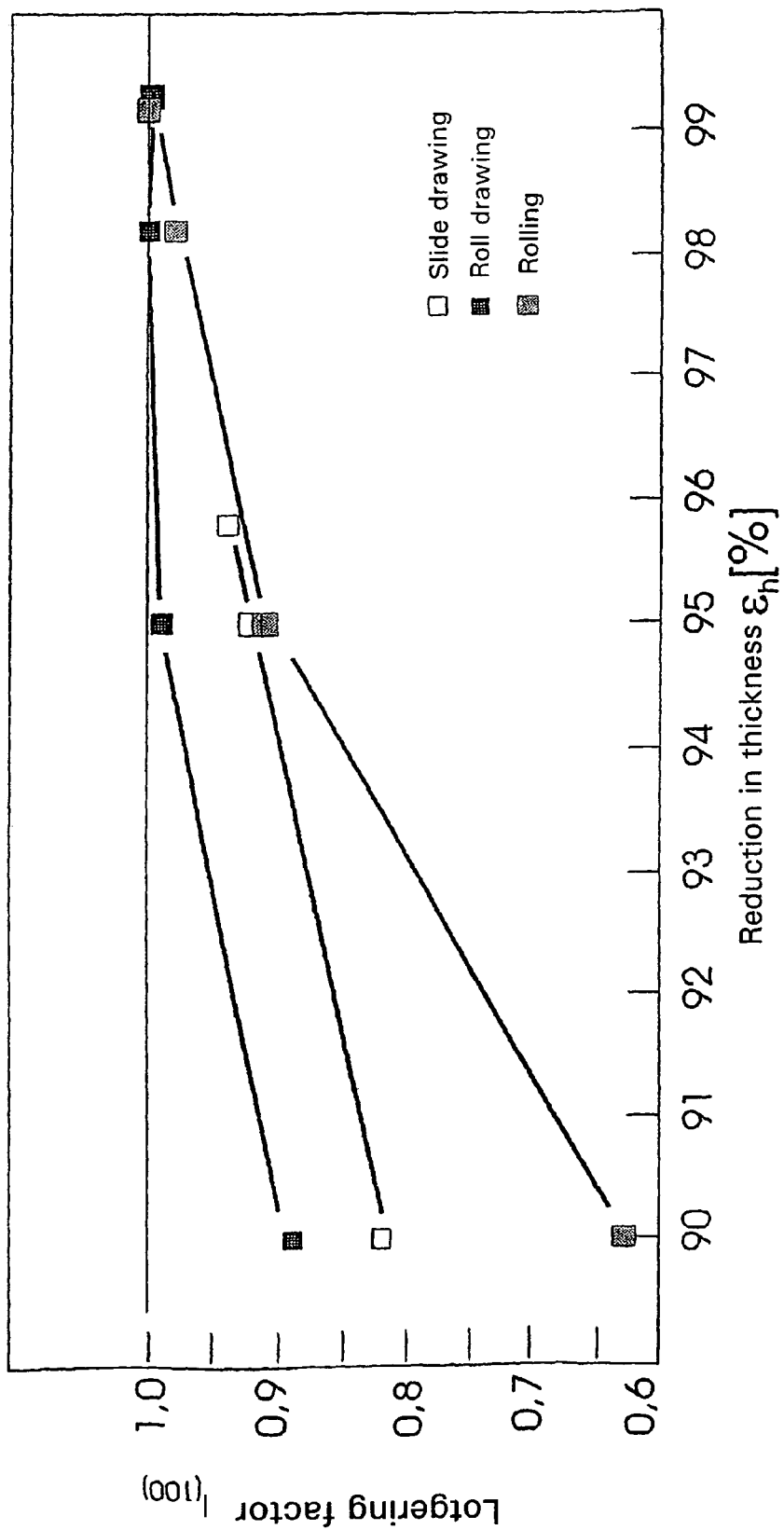

FIG. 3 shows half widths of x-ray (111) poles of nickel strips with a cubic texture after different decreases in thickness after roll drawing, slide drawing and rolling and subsequent recrystallization at 800° C. for 30 mm in hydrogen gas, and FIG. 4 shows a diagram of the effect of the conversion method and the degree of conversion on the extent to which the recrystallization cubic texture is developed in nickel strips. In this figure the Lotgering factor $I_{(100)}$ is used instead of pole figures for characterizing the degree of cubic texture.

EXAMPLE 1

Technically pure nickel rod material with a degree of purity of 99.9 atom percent and starting dimensions of 10 mm×10 mm is soft annealed. Subsequently, for producing the cubic texture, the rod is rolled-pulled through freely rotatable rolls to a strip thickness of 0.5 mm ($\epsilon_h$=95%) and annealed at 600° C. A sharp cubic texture is formed. This is confirmed by FIGS. 1(*a*) to 1(*c*). The measured intensities in the pole figure (WZ 0.5 RK6) are clearly higher than after a prior conversion by rolling (FIGS. 2(*a*) to 2(*c*), W 0.5 RK6). The maximum values of the intensities are 1211 after roll drawing and annealing and 876 after rolling and annealing. Accordingly, the roll drawing leads to a maximum intensity, which is 38% higher than that achieved by cold rolling. Due to the use of the drawing, there is a significant improvement with respect to the half widths (FWHM values), which are representative of the sharpness of the texture (FIG. 3). For the same reduction in thickness of $\epsilon_h$=95%, the following FWHM values are obtained after the heat treatment at 800° C.: a) rolling: 12.21, b) slide drawing: 10.41, and c) roll drawing: 9.46. The FWHM value, achieved by means of rolling, is therefore 29% inferior to that achieved by means of roll drawing (FIG. 3). The positive effect of roll drawing is shown even more clearly at lower conversions. For a 1 mm strip thickness ($\epsilon_h$=90%), the Lodgering factor after roll drawing is $I_{(100)}$=0.88 and after rolling $I_{(100)}$=0.63. The relative improvement by roll drawing is 40% (FIG. 4).

FIG. 4 shows that an $I_{(100)} \approx 1.0$ is attained after roll drawing already after a reduction in thickness of 95%, whereas about 99% is required for rolling. In order to attain the texture state, attained as a result of roll drawing at a material thickness of 500 μm, it is necessary to convert further up to about 100 μm (FIG. 4).

As confirmed by the results in FIGS. 3 and 4, not only roll drawing, but also slide drawing is more advantageous than rolling for forming the cubic texture in nickel. This advantageous effect of slide drawing is surprising, since previously, in copper, the effect of slide drawing was equivalent to that of rolling (W. M. Baldwin: Trans. ASM 39 (1147) 737-739); this did not appear to be attractive technologically and was obviously not pursued further for this reason.

EXAMPLE 2

Technically pure nickel with a degree of purity of 99.9 atom percent, after being cast in a copper mold with a cross-section of about 40 mm×40 mm, is reworked by chip removal, then hot rolled to 20 mm×20 mm and annealed at 1050° C. to homogenize it. In order to provide a finely-grain structure, a 10 mm×10 mm cross-section is cold rolled and annealed so as to recrystallize it. From a thickness of 10 mm, the sample is slide drawn to a thickness of 2.5 mm. This is followed by cold conversion by roll drawing to a final thickness of 0.25 mm. A heat treatment at 800° C. follows in order to produce the high-grade cubic texture in the nickel strip.

EXAMPLE 3

A nickel alloy, containing 5 atom percent of tungsten, is cold rolled from a cross-sectional dimensions of 20×20 m² to a thickness of 3 mm and recrystallized at 850° C. in order to produce a finely crystalline structure. A thickness of 3 mm is roll drawn to a thickness of 0.15 mm and annealed at 1000° C. to achieve a high-grade cubic texture. It is, however, also possible to carry out the roll drawing only to 0.20 mm thickness and to undertake the final rolling to 0.15 mm with polished rollers, in order to achieve the highest possible surface quality of the strip with minimum roughness.

EXAMPLE 4

After an initial annealing, copper sheet, 10 mm thick, is cold drawn to the final thickness dimension of 0.08 mm through freely rotatable rolls in order to produce a soft structure. During the subsequent 30-minute heat treatment at 400° C., a sharp cubic texture is formed in the strip material.

The invention claimed is:

1. A method for producing a metallic strip with a recrystallization cube texture, comprising:
    substantially deforming a material by cold drawing with
        a) roller equipment, which is not driven, having an axially parallel, flat roller-pair or having a Turk-head arrangement with two roller pairs, or with b) stationary, mutually inclined drawing jaws; and
    after said substantially deforming said material by cold drawing, performing recrystallization annealing on said material to obtain said metallic strip with a recrystallization cube texture, wherein
    said metallic strip with a recrystallization cube texture comprises nickel, copper, aluminum, silver or alloys of nickel, copper, aluminum, or silver.

2. The method of claim 1, wherein the cold drawing is carried out with a total reduction in thickness $\epsilon_h$ of more than 50%.

3. The method of claim 1, wherein the cold drawing is combined with deformation by rolling.

4. The method of claim 3, wherein in the combined application of cold drawing and deformation by rolling, the method of cold drawing is predominantly employed.

5. The method of claim 1, further comprising smoothing a surface of the metallic strip by fine working.

6. The method of claim 2, wherein the cold drawing is carried out with a total reduction in thickness $\epsilon_h$ of more than 90%.

7. The method of claim 1, wherein said alloys of nickel comprise austenitic iron-nickel alloys.

8. The method of claim 5, wherein said fine working comprises finishing by rolling or burnishing.

* * * * *